US005936431A

United States Patent [19]

Kim

[11] Patent Number: 5,936,431

[45] Date of Patent: Aug. 10, 1999

[54] INPUT SIGNAL VARIATION DETECTION CIRCUIT

[75] Inventor: Kyung Saeng Kim, Choongcheongbuk-Do, Rep. of Korea

[73] Assignee: LG Semicon Co., Ltd., Cheongju, Rep. of Korea

[21] Appl. No.: 08/903,430

[22] Filed: Jul. 30, 1997

[30] Foreign Application Priority Data

Jul. 30, 1996 [KR] Rep. of Korea ...................... 96-31422

[51] Int. Cl.[6] ................................ H03K 5/19; H03K 9/08

[52] U.S. Cl. ................................................ 327/18; 327/26

[58] Field of Search .................................... 327/3, 12, 14, 327/18–20, 22–26, 31, 36–38, 40–41, 43–44, 47, 49, 172, 176, 269–272, 352, 361

[56] References Cited

U.S. PATENT DOCUMENTS

| | | | |
|---|---|---|---|
| 5,424,661 | 6/1995 | Lin et al. | 327/18 |
| 5,661,419 | 8/1997 | Bhagwan | 327/8 |
| 5,696,463 | 12/1997 | Kwon | 327/172 |
| 5,777,492 | 7/1998 | Suyama et al. | 327/18 |

*Primary Examiner*—My-Trang Nu Ton

*Attorney, Agent, or Firm*—Fleshner & Kim

[57] ABSTRACT

An input signal variation detection circuit effectively detects transitions of input signals from a memory apparatus. The circuit includes a plurality of unit blocks for detecting transitions of input signals and for outputting transition detection signals corresponding to the transition direction, e.g., from high to low level or from low to high level, a first transistor having a drain coupled for receiving a transition detection signal from the unit blocks, a gate coupled for receiving a first prescribed voltage, and a source coupled for receiving a second prescribed voltage, and an OR-gate for ORing a transition detection signal from the unit blocks and outputting a summation signal.

28 Claims, 6 Drawing Sheets

INPUT SIGNAL VARIATION DETECTION CIRCUIT

BACKGROUND OF THE INVENTION

1. Field of the Invention

The present invention relates to an input signal variation detection circuit, and in particular, to an improved input signal variation detection circuit for detecting transitions of input signals from a memory apparatus.

2. Background of the Related Art

FIG. 1A is a block diagram illustrating an input signal variation detection circuit of a related art, which includes a plurality of unit blocks UB1 through UBn, and a summation block SB. The corresponding unit blocks UB1-UBn detect transitions of signals AN1 through ANn and output transition detection signals ATD1 through ATDn. The summation block SB outputs a summation signal ATDSUM in accordance with the transition detection signals ATD1 through ATDn from the unit blocks UB1 through UBn.

Each unit block UBx ($1 \leqq x \leqq n$) of the unit blocks UB1 through UBn, is shown in Figure 1B. An inverter 10 inverts an input signal ANx, and an inverter 12 inverts the output signal from the inverter 10 and outputs the signal to a node a1. An inverter 14 inverts the output signal from the inverter 12 and outputs the signal to a node a2. A transmission gate 16 receives the signal from the node a2 through an NMOS transistor 20, and the signal from the node a1 through a PMOS transistor 18 to control the transmission of the input signal ANx. A PMOS transistor 18 has the gate coupled for receiving the input signal ANx, the source coupled for receiving the signal from the node a1, and the drain coupled to the output terminal of the transmission gate 16 for outputting the transition detection signal ATDx. An NMOS transistor 20 has the drain connected to the drain of the PMOS transistor 18, the gate coupled for receiving the input signal ANx, and the source commonly connected with the output terminal of the inverter 14 through the node a2 and the NMOS transistor of the transmission gate 16.

The summation block SB is shown in FIG. 1C. NMOS transistors NM1 through NMn have the gates coupled for receiving transition detection signals ATD1 through ATDn from the unit blocks UB1 through UBn, respectively. Each of the sources is coupled for receiving a ground voltage Vss, and each of the drains is connected to a common node b1. An inverter 22 inverts the signal from the common node b1, and an inverter 24 inverts the output signal from the inverter 22. A NOR-gate 26 logically NORs the output signal from the inverter 24 and the signal from the common node b1, and an inverter 28 inverts the output signal from the NOR-gate 26. A PMOS transistor 30 has the gate coupled for receiving the output signal from the inverter 28, the source coupled for receiving the voltage VCC, and the drain connected to the common node b1. An inverter 32 inverts the signal from the common node b1 and outputs a summation signal ATDSUM.

The operation of the input signal variation detection circuit is as follows. First, if the input signal ANx is a low level or a high level, the unit block UBx always outputs a low level transition detection signal ATDx.

When the input signal ANx transits from a high level to a low level, the PMOS transistor 18 is turned on, and the NMOS transistor 20 is turned off. Hence, the high level signal from the source of the PMOS transistor 18 is outputted as a transition detection signal ATDx. The inverter 10 outputs a high level signal to the inverter 12, and the inverter 12 outputs a low level signal. Therefore, the output signal from the inverter 12 is delayed for a predetermined time after the transit of the input signal ANx from a high level to a low level. If the inverter 12 outputs a low level signal, and the inverter 14 outputs a high level signal, the transmission gate 16 is turned on, and the low level input signal ANx passed through the transmission gate 16, and the low level signal from the source of the PMOS transistor 18 is outputted as a transition detection signal ATDx.

As a result, if the input signal ANx transits from a high level to a low level, the inverters 10 and 12 maintain a turned-off state for a predetermined time. The transition detection signal ATDx from the unit block UBx becomes a high level pulse signal for a predetermined time.

In addition, if the input signal ANx transits from a low level to a high level, the PMOS transistor 18 is turned off, and the NMOS transistor 20 is turned on. The transition gate 16 maintains a turned-on state for a predetermined delay time due to the inverters 10 and 12, and the high level signal passing through the transmission gate 16 is outputted as the transition detection signal ATDx.

After a lapse of the predetermined delay time by the inverters 10 and 12, the output signal from the inverter 12 transits from a low level to a high level, and the output signal from the inverter 14 transits from a high level to a low level, and the transmission gate 16 is turned off. Therefore, the low level signal from the inverter 14 is outputted through the NMOS transistor 20 as a transition detection signal ATDx.

As a result, if the input signal ANx transits from a low level to a high level, the unit block UBx outputs the transition detection signal ATD1, which is high level pulse signal, which is delayed by the inverters 10 and 12, for a predetermined time.

As shown in FIG. 1C, the summation block SB sums the transition detection signals ATD1 through ATDn from the unit blocks UB1 through UBn to output a summation signal ATDSUM. Namely, since the NMOS transistors (NM1 through NMn) are turned on while the transition detection signals ATD1 through ATDn are at a high level, the electric potential of the common node b1 is low level.

The signal from the common node b1 is sequentially inverted by the inverters 22 and 24 and is supplied to the NOR-gate 26. The NOR-gate 26 NORs the low level signal from the inverter 24 and the low level signal from the common node b1 to output a high level signal to the inverter 28. The inverter 28 inverts the inputted high level signal and outputs a low level signal to the gate of the PMOS transistor 30, which turns on the PMOS transistor 30. Therefore, the voltage VCC is supplied to the common node b1 through the PMOS transistor 30. As a result, the inverter 32 inverts the low level signal from the common node b1 and outputs a summation signal ATDSUM which is a pulse signal having the level of the voltage VCC.

However, in the input signal variation detection circuit of the background art, the speed for detecting the transition of the input signal is determined by the capacity, e.g., the number, of inverters within the unit blocks. Therefore, it is not possible to obtain high speed operation, and low electrical power consumption.

The above references are incorporated by reference herein where appropriate for appropriate teachings of additional or alternative details, features and/or technical background.

SUMMARY OF THE INVENTION

Accordingly, it is an object of the present invention to overcome the aforementioned problems of the background art.

It is another object of the present invention to effectively detect transitions of input signals from a memory apparatus.

To achieve the above objects, there is provided an input signal variation detection circuit, comprising: a plurality of unit blocks for detecting transitions of corresponding input signals and for outputting transition detection signals corresponding to the transitions; and a summation circuit having a first transistor having a first electrode coupled for receiving the transition detection signals from the unit blocks, a control electrode coupled for receiving a first prescribed voltage, and a second electrode coupled for receiving a second prescribed voltage; and a first logic gate for performing a logical operation of the transition detection signals from the unit blocks to output a summation signal.

The present invention may be achieved in whole or part by a circuit for detecting a variation of an input signal, comprising: a) at least one unit block coupled for receiving the input signal, the unit block having i) a first detector coupled for receiving the input signal, the first detector outputting a first signal of a first prescribed duration when the input signal transits from a first state to a second state, and ii) a second detector coupled for receiving the same input signal, the second detector outputting a second signal of a second prescribed duration when the input signal transits from the second state to the first state; and b) a summation circuit coupled to the first and second detectors such that the summation circuit provides a summation of the first signal and the second signal.

The invention can be also achieved in whole or in part by a detector for an input signal variation detection circuit, comprising: a first plurality of delay elements coupled in series, a first delay element of the first plurality of delay elements being coupled for receiving an input signal; and a first plurality of transistors coupled in series, each of the first plurality of transistors having a control electrode coupled to a corresponding output of the plurality of delay elements, wherein a serial connection between second electrodes of the second and third transistors forms a first node for providing a first signal indicative of a variation of the input signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
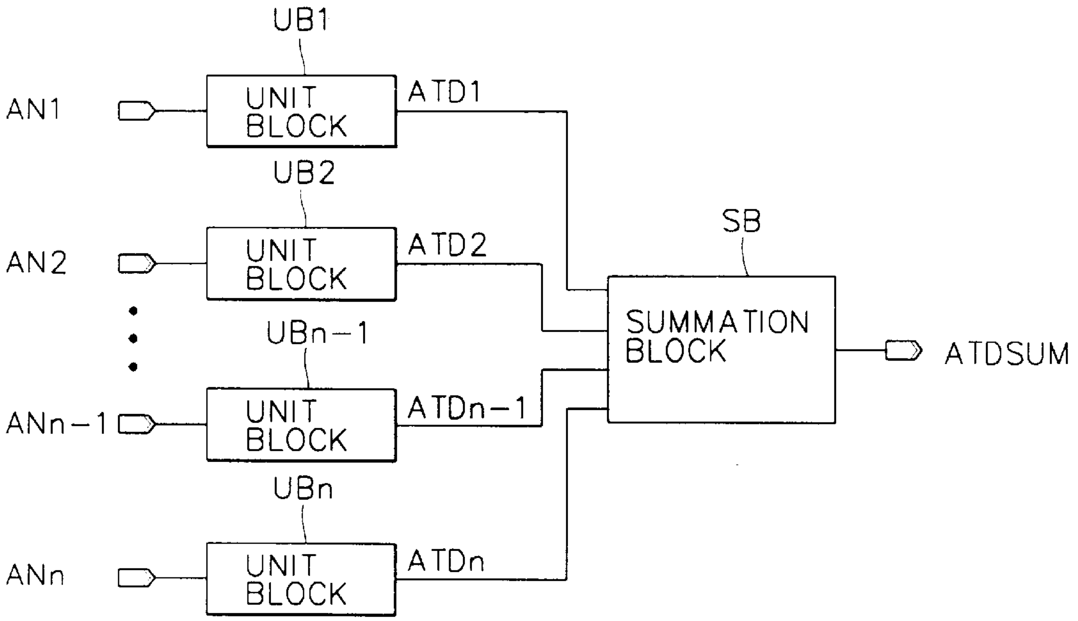
FIG. 1A is a block diagram illustrating an input signal variation detection circuit of the background art.
Figure 1B:
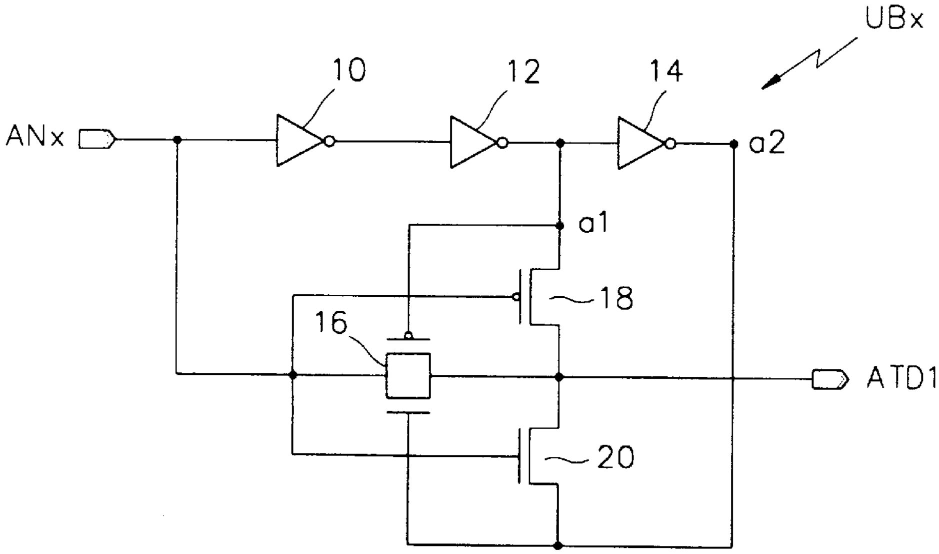
FIG. 1B is a detailed circuit diagram illustrating a unit block as shown in FIG. 1A.
Figure 1C:
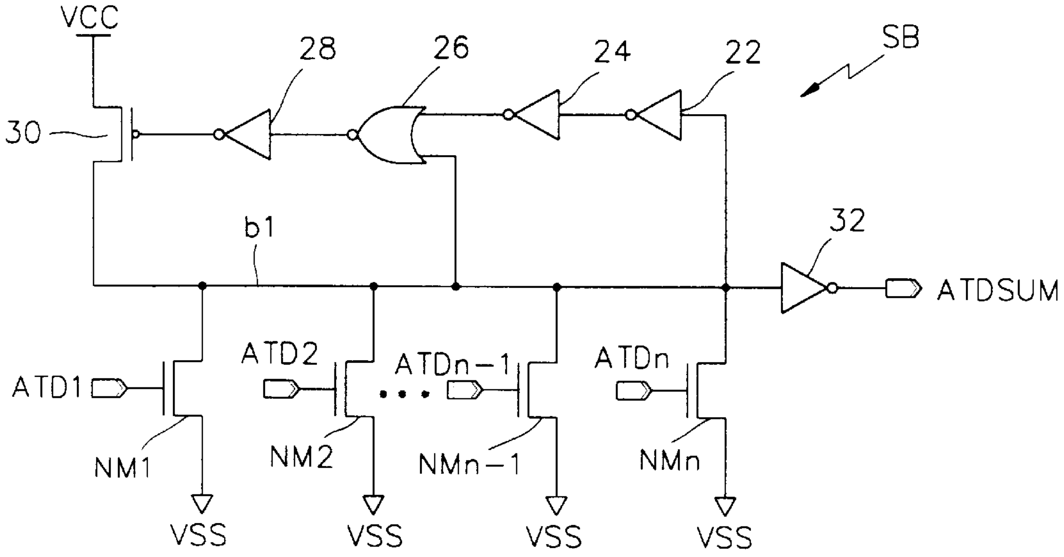
FIG. 1C is a detailed circuit diagram illustrating a summation block as shown in FIG. 1A.
Figure 2A:
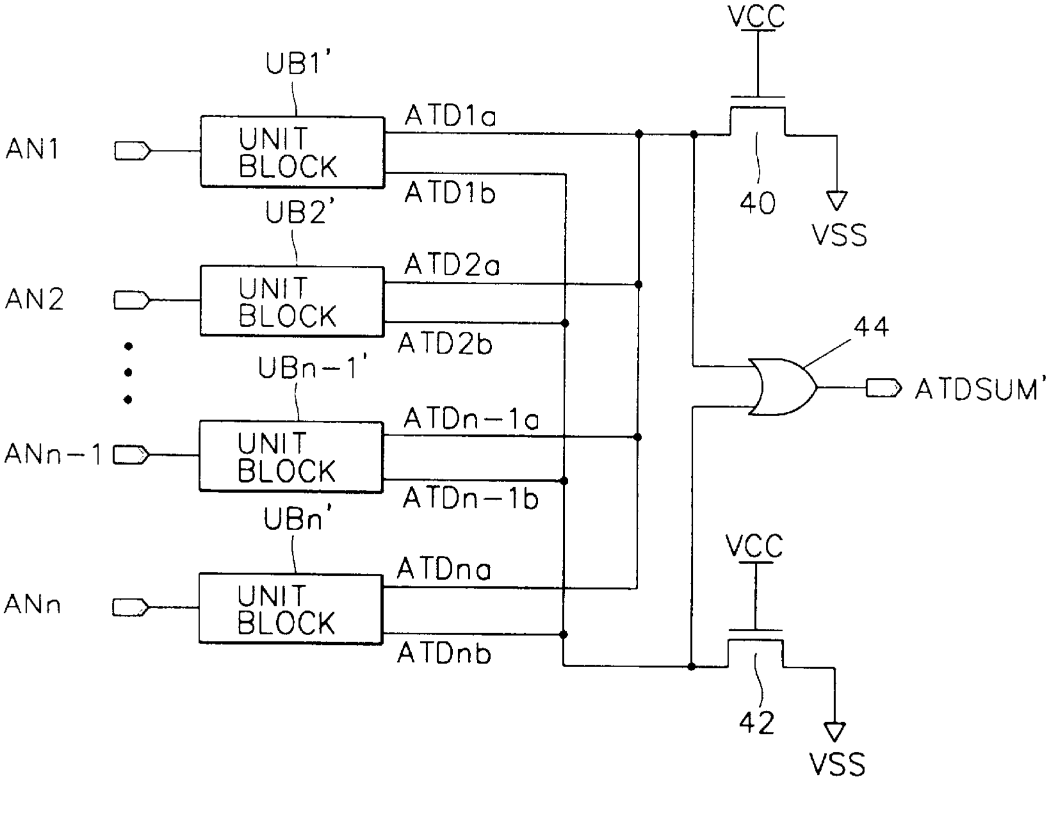
FIG. 2A is a block diagram illustrating an input signal variation detection circuit according to the present invention.

FIG. 2A is a block diagram illustrating an input signal variation detection circuit according to the present invention. As shown therein, the input signal variation detection circuit according to the present invention includes unit blocks UB1' through UBn' coupled to transistors 40 and 42 and a logic gate 44 to output a summation signal ATDSUM'. In the preferred embodiment, the transistors 40 and 42 are NMOS transistors, and the gate 44 is an OR-gate. The unit blocks UB1'-UBn' detect the transition of signals AN1 through ANn and output transition detection signals (ATD1*a*, ATD1*b*), . . . , (ATDna, ATDnb), respectively. Each of the NMOS transistors 40 and 42 includes a drain coupled for receiving transition detection signals (ATD1*a* through ATDna) and (ATD1*b* through ATDnb) from the unit blocks UB1' through UBn', respectively, a gate coupled for receiving a voltage VCC, and a source coupled for receiving a ground voltage Vss. The OR-gate 44 performs a logical operation of the transition detection signals (ATD1*a* through ATDna) and (ATD1*b* through ATDnb) from the unit blocks UB1' through UBn' and outputs the summation signal ATDSUM'.

Figure 2B:
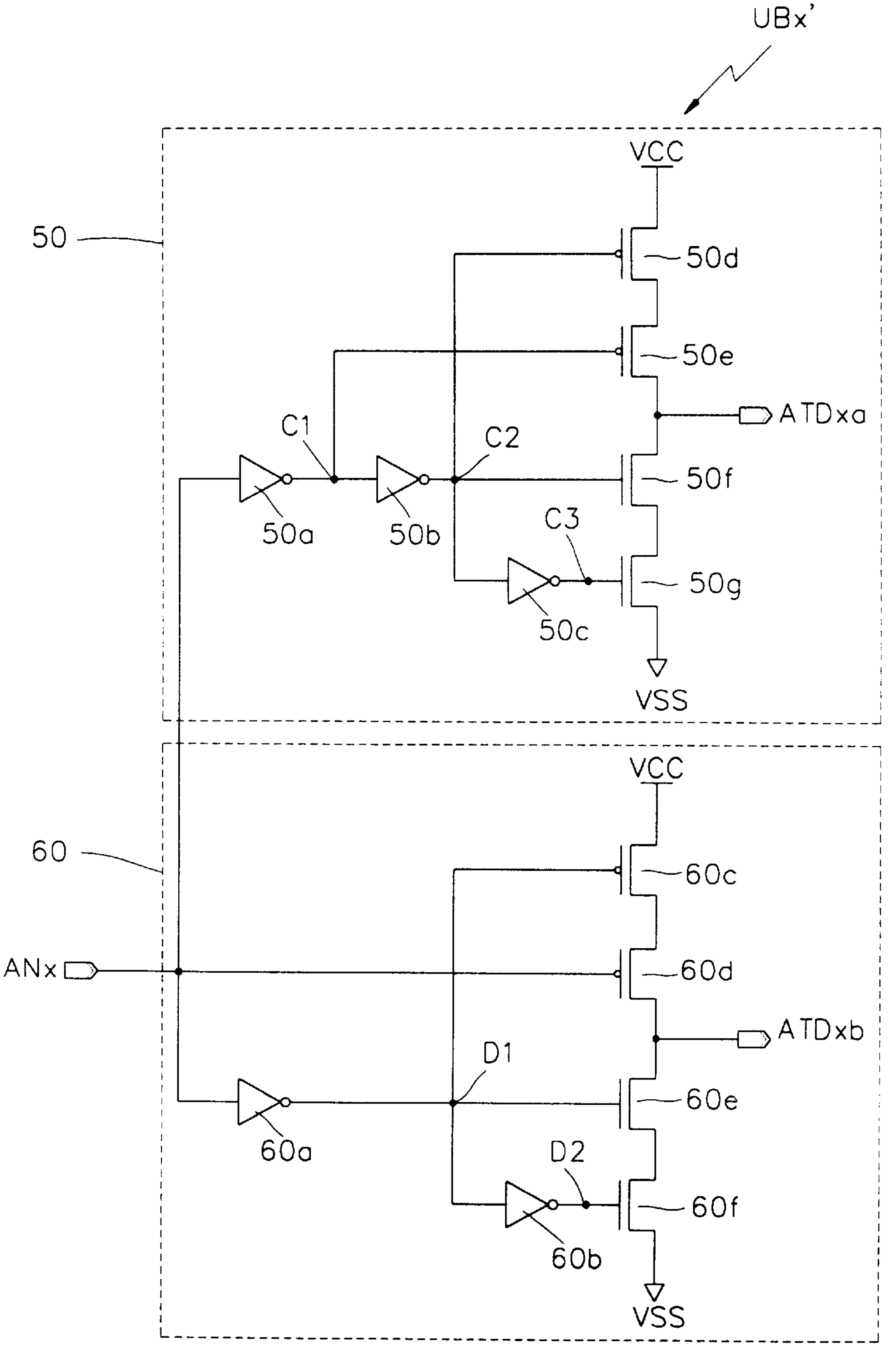
FIG. 2B is a detailed circuit diagram illustrating a unit block as shown in FIG. 2A.

Each unit block UBx', as shown in FIG. 2B, includes a first transition detector 50 for outputting a first transition detection pulse signal ATDxa of a first prescribed level, e.g., a high level, for a predetermined time when the input signal transits from a first state, e.g., a low level to a second state, e.g., a high level, and a second transition detector 60 for outputting a second transition detection pulse signal ATDxb of a second prescribed level, e.g., a high level, when the input signal ANx transits from a high level to a low level.

The first transition detector 50 includes a first plurality of delay elements, e.g., inverters 50*a*, 50*b* and 50*c*, coupled in series, and a first plurality of transistors 50*d*–50*e* coupled in series. A first inverter 50*a* inverts the input signal ANx and outputs the signal to a node C1; a second inverter 50*b* inverts the signal from the node C1 and outputs the signal to a node C2; and an inverter 50*c* inverts the signal from the node C2 and outputs the signal to a node C3.

A first transistor 50*d* receives the signal VC2 from the node C2 and has the source coupled for receiving a first prescribed voltage. A second transistor 50*e* has the gate coupled for receiving the signal VC1 from the node C1, the source connected to the drain of the first transistor 50*d*, and the drain coupled for outputting a transition detection signal ATDxa. A third transistor 50*f* has the gate coupled for receiving the signal VC2 from the node C2 and the drain connected to the drain of the second transistor 50*e*. A fourth transistor 50*g* has the gate coupled for receiving the signal VC3 from the node C3, the drain connected to the source of the third transistor 50*f*, and the source coupled for receiving a second prescribed voltage. In the preferred embodiment, the first and second transistors comprise PMOS transistors and the third and fourth transistors comprise NMOS transistors, where first and second prescribed voltages comprise source and ground voltages, Vcc and Vss, respectively.

The second transition detector 60 includes a second plurality delay elements, e.g., inverters 60*a* and 60*b*, coupled in series and a second plurality of transistors 60*c*–60*f* coupled in series. The first inverter 60*a* of the second plurality of delay elements inverts the input signal ANx and outputs the signal to the node D1. A second inverter 60*b* of the plurality of delay elements inverts the signal from the node D1 and outputs the signal to the node D2.

A first transistor 60*c* of the second plurality of transistors has a gate coupled for receiving the signal VD1 from the node D1 and a source coupled for receiving a first prescribed voltage. A second transistor 60*d* of the second plurality of transistors has a gate coupled for receiving the signal ANx, a source connected to the drain of the first transistor 60*c*, and a drain coupled for outputting a transition detection signal ATDxb. The third transistor 60*e* of the second plurality of transistors has a gate coupled for receiving the signal VD1 from the node D1 and a drain connected to the drain of the second transistor 60*d*. The fourth transistor 60*f* of the plurality of second transistors has a gate coupled for receiving the signal VD2 from the node D2, a drain connected to the source of the third transistor 60*e*, and a source coupled for receiving a second prescribed voltage. In the preferred embodiment, the first and second transistors 60*c* and 60*d* comprise PMOS transistors and the third and fourth transistors 60*e* and 60*f* comprise NMOS transistors, where first and second prescribed voltages comprise source and ground voltages, Vcc and Vss, respectively.

The operation and effects of the input signal variation detection circuit according to the present invention will now be explained with reference to the accompanying drawings.

If the input signal ANx is a low level or a high level, the output terminals of the unit block UBx' for outputting the transition detection signals ATDxa and ATDxb become high impedance state. In addition, the output terminals of the unit block UB1' have low level electric potentials by the turned-on NMOS transistors 40 and 42. Namely, the NMOS transistors 40 and 42 are used for preventing the output terminals of the unit block UB1' to become high impedance state. Therefore, when the input signal ANx is a low level or a high level, the summation signal ATDSUM' from the OR-gate 44 is low level.

Figure 3A:
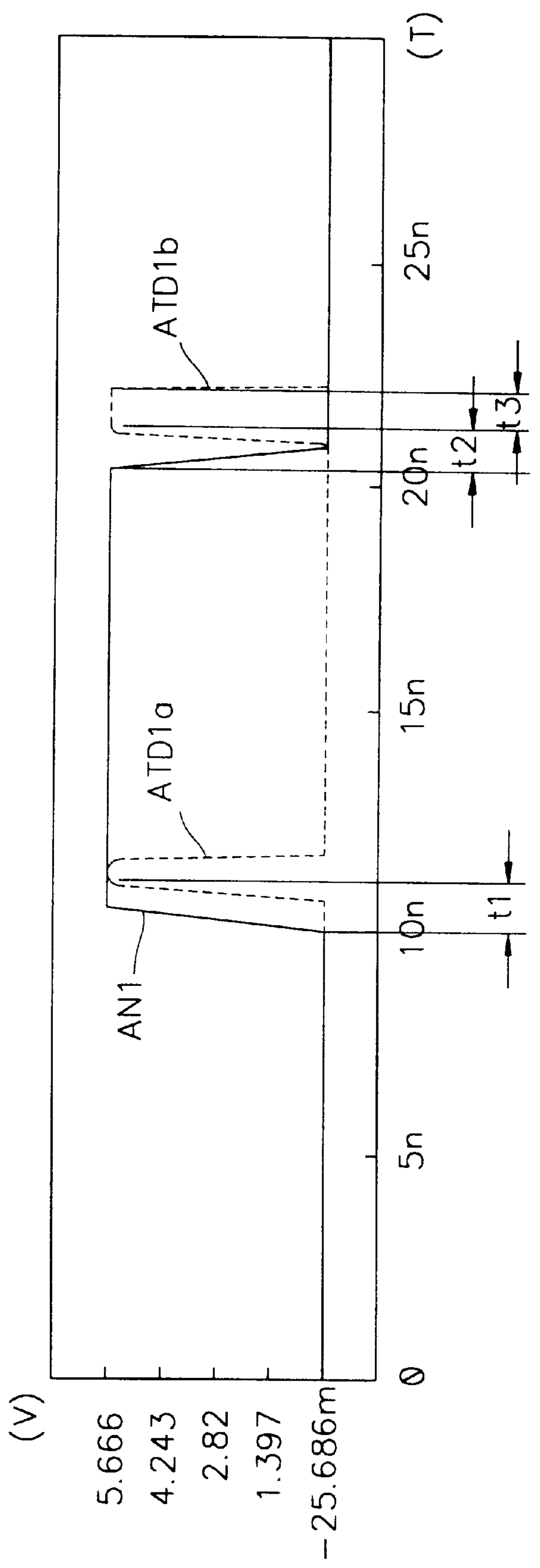
FIG. 3A is a waveform of an input signal and transition detection signal from a unit block as shown in FIGS. 2A and 2B.
Figure 3B:
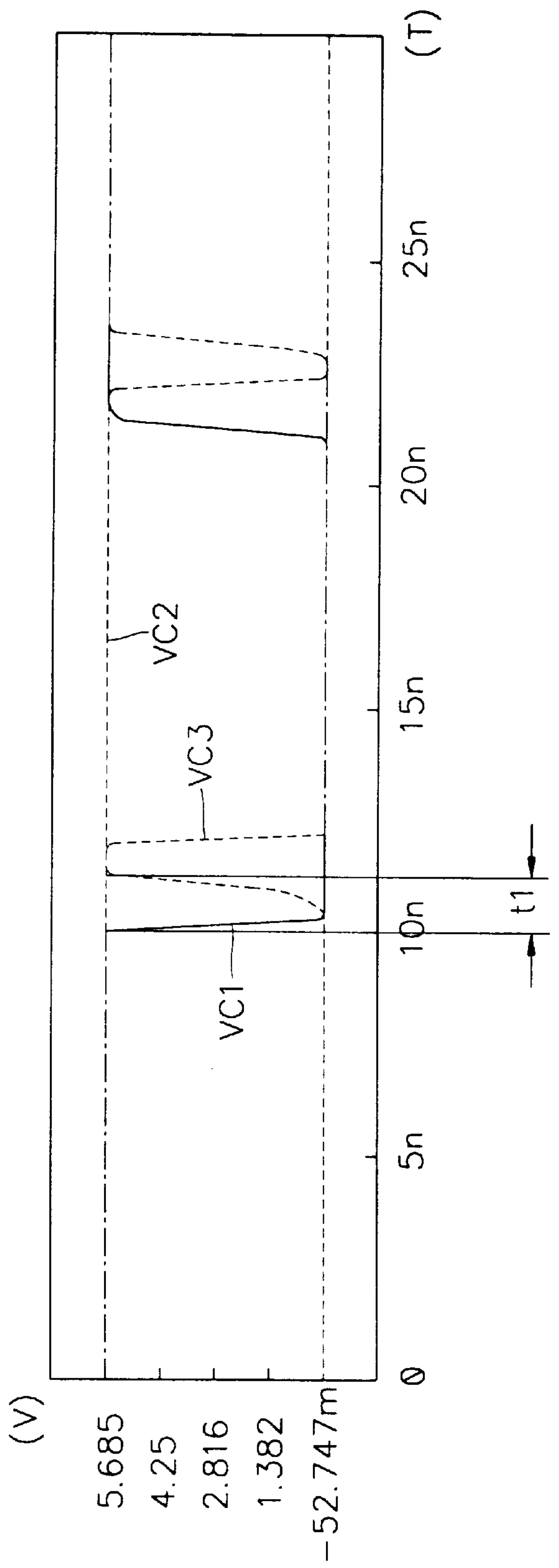
FIG. 3B is a waveform of a signal from an inverter of a first transition detector according to the present invention.

When the input signal AN1, as shown in FIG. 3A, transits from a low level to a high level, the signal VC1 from the node C1, as shown in FIG. 3B, changes to a low level, and the signal VC2 from the node C2 maintains a low level for a predetermined time, as much as the delay time t1 of the inverter 50*b*.

Therefore, during the delay time t1, the PMOS transistors 50*d* and 50*e* are turned on by the inverter 50*b*; the NMOS transistor 50*f* is turned off; and the NMOS transistor 50*g* is turned on. Hence, the output terminal of the transition detection signal ATDxa is charged by the source voltage VCC. After the delay time, the NMOS transistor 50*f* is turned on, and the output terminal of the transition detection signal ATD1*a* is charged. As a result, the first transition detector 50 outputs a first transition detection pulse signal ATDxa, as shown in FIG. 3A. Since the PMOS transistor 60*d* and the NMOS transistor 60*e* of the second transition detector 60 are turned off, the output terminal of the transition detection signal ATDxb becomes high impedance state.

Figure 3C:
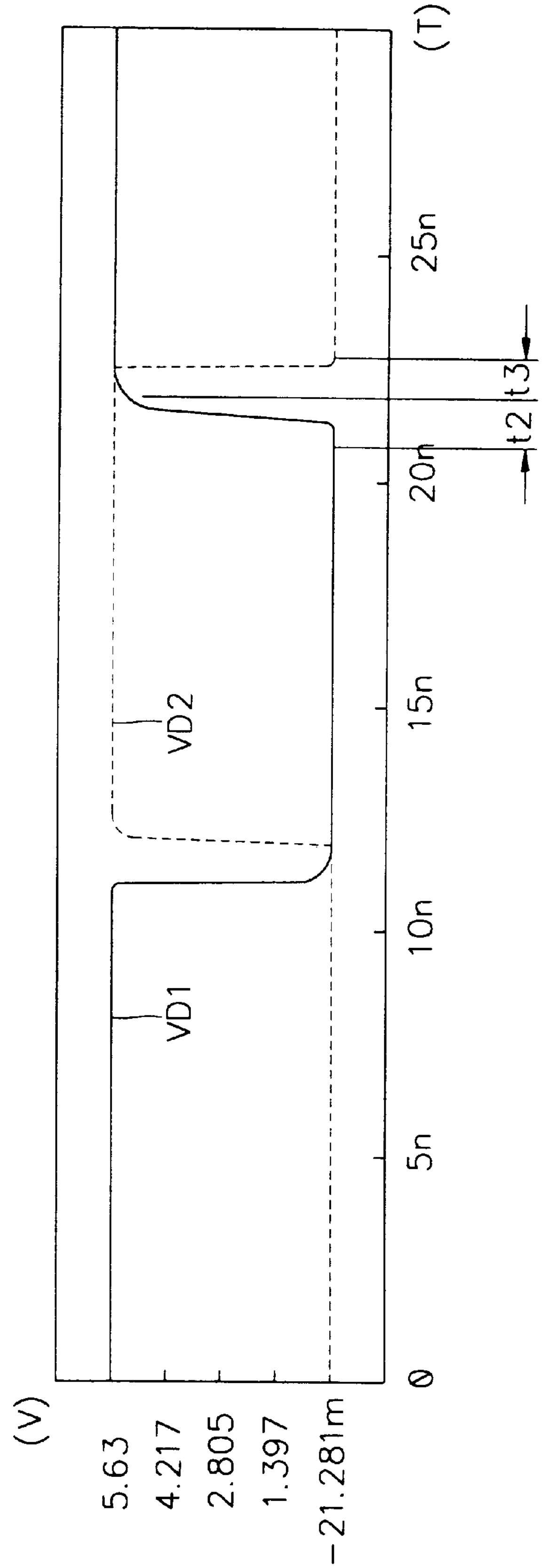
FIG. 3C is a waveform of a signal from an inverter of a second transition detector according to the present invention.

In addition, as shown in FIG. 3A, if the input signal ANx changes from a high level to a low level, the PMOS transistor 60*d* of the second transition detector 60 is turned on. In addition, as shown in FIG. 3C, since the signal VD1 from the node D1 maintains low level during a delay time t2 by the inverter 60*a*, the PMOS transistor 60*c* is turned on, and the NMOS transistor 60*e* is turned off.

Therefore, the output terminal outputting the transition detection signal ATDxb is charged by the source voltage VCC during the delay time t2 by the inverter 60*a*. After the delay time t2 by the inverter 60*a*, the PMOS transistor 60*c* is turned off, and the NMOS transistor 60*e* is turned on. In addition, as shown in FIG. 3C, since the signal VD2 from the node D2 maintains a high level during the delay time t3 of the inverter 60*b*, the NMOS transistor 60*f* is turned on. Therefore, the output terminal of the transition detection signal ATDxb is charged.

As a result, the second transition detector 60 outputs a transition detection signal ATDxb as shown in FIG. 3A. Since the PMOS transistor 50*e* and the NMOS transistor 50*f* of the first transition detector 50 are turned off, the output terminal of the transition detection signal ATDxa becomes high impedance state. The transition detection signal ATDxa from the unit block UBx' is summed by the OR-gate 44, for outputting the summation signal ATDSUM1'. All the unit blocks UB1' through UBn' are operated in the same manner.

As described above, the input signal variation detection circuit according to the present invention improves the detection speed by providing the first transition detector and the second transition detector for detecting the transition direction and inverters, which each have different logic threshold values, of the first transition detector 50 and the second transition detector 60.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An input signal variation detection circuit, comprising:

a plurality of unit blocks for detecting transitions of corresponding input signals and for outputting transition detection signals corresponding to the transitions; and a summation circuit having a first transistor having a first electrode coupled for receiving the transition detection signals from said unit blocks, a control electrode coupled for receiving a first prescribed voltage, and a second electrode coupled for receiving a second prescribed voltage; and a first logic gate for performing a logical operation of the transition detection signals from the, unit blocks to output a summation signal.

2. The circuit of claim 1, wherein each of said unit blocks includes:

a first transition detector for outputting a first transition detection signal of a predetermined first pulse signal, when one of the corresponding input signals transits from a low level to a high level; and a second transition detection signal for outputting a second transition detection signal of a predetermined second pulse signal, when the corresponding one of the input signals transits from a high level to a low level.

3. The circuit of claim 2, wherein said first transition detector includes:

a first inverter for inverting an the corresponding one of the a second inverter for inverting an output signal from the first inverter;

a third inverter for inverting an output signal from the second inverter;

a first PMOS transistor having a gate coupled for receiving the output signal from the second inverter and a source coupled for receiving the first prescribed voltage;

a second PMOS transistor having a gate coupled for receiving the output signal from the first inverter, a source connected to the drain of the first PMOS transistor, and a drain coupled for providing the first transition detection signal;

a first NMOS transistor having a gate coupled for receiving the output signal from the second inverter and a drain connected to the drain of the second PMOS transistor; and a second NMOS transistor having a gate coupled for receiving an output signal from the third inverter, a drain connected to the source of the first NMOS transistor, and a source coupled for receiving the second prescribed voltage.

4. The circuit of claim 2, wherein said second transition detector includes:

a first inverter for inverting the corresponding one of the a second inverter for inverting an output signal from the first inverter;

a first PMOS transistor having a gate coupled for receiving the output signal from the first inverter and a source coupled for receiving the first prescribed voltage;

a second PMOS transistor having a gate coupled for receiving the input signal, a source connected to the drain of the first PMOS transistor, and a drain coupled for outputting the second transition detection signal;

a first NMOS transistor having a gate coupled for receiving the output signal from the first inverter and a drain connected to the drain of the second PMOS transistor; and a second NMOS transistor having a gate coupled for receiving an output signal of the second inverter, a drain connected to the source of the first NMOS transistor, and a source coupled for receiving the second prescribed voltage.

5. A circuit for detecting a variation of an input signal, comprising:

a) at least one unit block coupled for receiving the input signal, said unit block having i) a first detector coupled for receiving the input signal, said first detector outputting a first signal of a first prescribed duration when the input signal transits from a first state to a second state, and ii) a second detector coupled for receiving the same input signal, said second detector outputting a second signal of a second prescribed duration when the input signal transits from the second state to the first state, wherein one of said first detector and said second detector comprises;

a plurality of delay elements coupled in series, a first delay element of said plurality of delay elements being coupled for receiving the input signal; and a plurality of transistors coupled in series, each of said plurality of transistors having a control electrode coupled to a corresponding output of said plurality of delay elements; and b) a summation circuit coupled to said first and second detectors such that said summation circuit provides a summation of the first signal and the second signal.

6. The circuit of claim 5, wherein said first detector outputs the first signal after a first prescribed period of time the input signal transits from the first state to the second state.

7. The circuit of claim 6, wherein said second detector outputs the second signal after a second prescribed period of time the input signal transits from the first state to the second state.

8. The circuit of claim 7, wherein the first and second periods of time are different.

9. The circuit of claim 5, wherein said summation circuit comprises:

a first transistor coupled to one of said first and second detectors; and a logic gate coupled to said first transistor and the other of the first and second detectors such that said logic gate provides a logical sum of the first and second signals.

10. The circuit of claim 9, wherein said first transistor has a control electrode and first and second electrodes, said control and second electrodes being coupled for receiving first and second prescribed voltages, respectively, and said first electrode being coupled to said first detector and said logic gate.

11. The circuit of claim 9, wherein said summation circuit further comprises a second transistor coupled to said other of the first and second detectors and said logic gate.

12. The circuit of claim 11, wherein said second transistor includes a control electrode and first and second electrodes, said control and second electrodes being coupled for receiving first and second prescribed voltages, respectively, and said first electrode being coupled to said other of the first and second detectors and said logic gate.

13. The circuit of claim 12, wherein said first and second transistors are NMOS transistors, and said first logic gate is an OR-gate.

14. The circuit of claim 5, wherein said plurality of delay elements of said first detector comprises first, second and third inverters, and said plurality of transistors of said first detector comprises first, second, third and fourth transistors respectively connected in series between first and second prescribed voltages, each transistor having first and second electrodes and the control electrode, the control electrode of said second transistor being coupled for receiving an output of said first inverter, the control electrodes of said first and third transistors being coupled for receiving an output of said second inverter, and the control electrode of said fourth transistor being coupled for receiving an output of said third inverter, wherein a serial connection between second electrodes of said second and third transistors forms a first node for providing the first signal.

15. The circuit of claim 14, wherein said first and second transistors are PMOS transistors, said third and fourth transistor are NMOS transistors, the first and second prescribed voltages are source and ground voltages, respectively, and the first and second states are low and high logic levels.

16. The circuit of claim 5, wherein said plurality of delay elements of said second detector comprises first and second inverters, and said plurality of transistors of said second detector comprises first, second, third and fourth transistors respectively connected in series between first and second prescribed voltages, each transistor having first and second electrodes and the control electrode, the control electrode of said second transistor being coupled for receiving the input signal, the control electrodes of said first and third transistors being coupled for receiving an output of said first inverter, and the control electrode of said fourth transistor being coupled for receiving an output of said second inverter, wherein a serial connection between second electrodes of said second and third transistors forms a second node for providing the second signal.

17. The circuit of claim 16, wherein said first and second transistors are PMOS transistors, said third and fourth transistors are NMOS transistors, the first and second prescribed voltages are source and ground voltages, respectively, and the first and second states are low and high logic levels.

18. A detector for an input signal variation detection circuit, comprising:

a first plurality of delay elements coupled in series, a first delay element of said first plurality of delay elements being coupled for receiving an input signal;

a first plurality of transistors coupled in series, each of said first plurality of transistors having a control electrode coupled to a corresponding output of said first plurality of delay elements, wherein a serial connection between second electrodes of second and third transistors of the first plurality of transistors forms a first node for providing a first signal indicative of a variation of the input signal;

a second plurality of delay elements coupled in series, a first delay element of said second plurality of delay elements being coupled for receiving the same input signal; and a second plurality of transistors coupled in series, each of said second plurality of transistors having a control electrode coupled to a corresponding output of said second plurality of delay elements, wherein a serial connection between second electrodes of second and third transistors of the second plurality of transistors forms a second node for providing a second signal indicative of the variation of the input signal.

19. The detector of claim 18, wherein said first plurality of delay elements comprises first, second and third inverters, and said first plurality of transistors comprises first, second, third and fourth transistors respectively connected in series between first and second prescribed voltages, each transistor having first and second electrodes and a control electrode, the control electrode of said second transistor being coupled for receiving an output of said first inverter, the control electrodes of said first and third transistors being coupled for receiving an output of said second inverter, and the control electrode of said fourth transistor being coupled for receiving an output of said third inverter.

20. The detector of claim 19, wherein said first and second transistors are PMOS transistors, said third and fourth transistors are NMOS transistors, and the first and second prescribed voltages are source and ground voltages, respectively.

21. The detector of claim 18, wherein said second plurality of delay elements comprises first and second inverters, and said second plurality of transistors comprises first, second, third and fourth transistors respectively connected in series between first and second prescribed voltages, each transistor having first and second electrodes and a control electrode, the control electrode of said second transistor being coupled for receiving the input signal, the control electrodes of said first and third transistors being coupled for receiving an output of said first inverter, and the control electrode of said fourth transistor being coupled for receiving an output of said second inverter.

22. The detector of claim 18, wherein said first and second transistors are PMOS transistors, said third and fourth transistors are NMOS transistors, and the first and second prescribed voltages are source and ground voltages, respectively.

23. The detector of claim 18 further comprising:

a first transistor coupled to the first node; and a logic gate coupled to said first transistor and the second node such that said logic gate provides a logical sum of the first and second signals.

24. The detector of claim 23, wherein said first transistor has a control electrode and first and second electrodes, said control and second electrodes being coupled for receiving first and second prescribed voltages, respectively, and said first electrode being coupled to the first node and said logic gate.

25. The detector of claim 24, further comprises a second transistor coupled to said second node and said logic gate.

26. The detector of claim 25, wherein said second transistor includes a control electrode and first and second electrodes, said control and second electrodes being coupled for receiving first and second prescribed voltages, respectively, and said first electrode being coupled to the second nodes and said logic gate.

27. The detector of claim 26, wherein said first and second transistors are NMOS transistors, and said first logic gate is an OR-gate.

28. A detector for an input signal variation detection circuit, comprising:

a first plurality of delay elements coupled in series, a first delay element of said first plurality of delay elements being coupled for receiving an input signal;

a first plurality of transistors coupled in series, each of said first plurality of transistors having a control electrode coupled to a corresponding output of said first plurality of delay elements, wherein a serial connection between second electrodes of second and third transistors of the first plurality of transistors forms a first node for providing a first signal indicative of a variation of the input signal, wherein said first plurality of delay elements comprises first, second and third inverters, and said first plurality of transistors comprises first, second, third and fourth transistors respectively connected in series between first and second prescribed voltages, each transistor having first and second electrodes and a control electrode, the control electrode of said second transistor being coupled for receiving an output of said first inverter, the control electrodes of said first and third transistors being coupled for receiving an output of said second inverter, and the control electrode of said fourth transistor being coupled for receiving an output of said third inverter.

* * * * *